(12) United States Patent
Arai et al.

(10) Patent No.: US 7,187,043 B2
(45) Date of Patent: Mar. 6, 2007

(54) MEMORY FUNCTION BODY, PARTICLE FORMING METHOD THEREFOR AND, MEMORY DEVICE, SEMICONDUCTOR DEVICE, AND ELECTRONIC EQUIPMENT HAVING THE MEMORY FUNCTION BODY

(75) Inventors: Nobutoshi Arai, Kitakatsuragi-gun (JP); Hiroshi Iwata, Ikoma-gun (JP); Seizo Kakimoto, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/796,963

(22) Filed: Mar. 11, 2004

(65) Prior Publication Data

US 2004/0180491 A1    Sep. 16, 2004

(30) Foreign Application Priority Data

Mar. 13, 2003    (JP)    ............................ P2003-067659

(51) Int. Cl.
*H01L 21/8238*    (2006.01)
(52) U.S. Cl. ...................... 257/405; 257/321; 257/322; 257/323; 257/324; 257/325; 438/200
(58) Field of Classification Search ........ 257/405–406, 257/315, 411
See application file for complete search history.

(56) References Cited

U.S. PATENT DOCUMENTS 6,297,095 B1 * 10/2001 Muralidhar et al. ........ 438/257

| 2003/0132432 | A1 * | 7/2003 | Yoshii et al. .................. 257/17 |
| 2004/0108512 | A1 * | 6/2004 | Iwata et al. .................. 257/100 |
| 2004/0115883 | A1 * | 6/2004 | Iwata et al. .................. 438/257 |
| 2004/0183647 | A1 * | 9/2004 | Arai et al. ...................... 338/13 |
| 2005/0072989 | A1 * | 4/2005 | Bawendi et al. ............ 257/200 |
| 2005/0151127 | A1 * | 7/2005 | Iwata et al. .................... 257/22 |
| 2006/0154432 | A1 * | 7/2006 | Arai et al. .................. 438/385 |

FOREIGN PATENT DOCUMENTS

| EP | 750353 | * | 12/1996 |
| JP | 2000-22005 A | | 1/2000 |
| JP | 2002-252290 | * | 9/2002 |

* cited by examiner

*Primary Examiner*—Leonardo Andujar
*Assistant Examiner*—Ahmed N Sefer
(74) *Attorney, Agent, or Firm*—Birch, Stewart, Kolasch & Birch, LLP

(57) ABSTRACT

A memory function body has a medium interposed between a first conductor (e.g., a conductive substrate) and a second conductor (e.g., an electrode) and consisting of a first material (e.g., silicon oxide or silicon nitride). The medium contains particles. Each particle is covered with a second material (e.g., silver oxide) and formed of a third material (e.g., silver). The second material functions as a barrier against passage of electric charges, and the third material has a function of retaining electric charges. The third material is introduced into the medium by, for example, a negative ion implantation method.

3 Claims, 9 Drawing Sheets

MEMORY FUNCTION BODY, PARTICLE FORMING METHOD THEREFOR AND, MEMORY DEVICE, SEMICONDUCTOR DEVICE, AND ELECTRONIC EQUIPMENT HAVING THE MEMORY FUNCTION BODY

This nonprovisional application claims priority under 35 U.S.C. §119(a) on Patent Application No. 2003-067659 filed in Japan on Mar. 13, 2003, the entire contents of which are hereby incorporated by reference.

BACKGROUND OF THE INVENTION

The present invention relates to a memory function body, a method for forming, for example, nanometer-size particles for use in this memory function body, a memory device, a semiconductor device and electronic equipment.

In recent years, as ultramicro electronic equipment that employs a nanometer-size particle or particles, there have been proposed, for example, a single-electron transistor and a memory that contains a particle or particles called the "nanodot" or "nanocrystal" in a gate insulation film.

As a method for forming such a particle for the electronic equipment, there is proposed a method that, to form a Si (silicon) particle, deposits amorphous silicon on a silicon thermal oxide film by the LPCVD (Low Pressure Chemical Vapor Deposition) system, thereafter forms a Si microcrystal through an annealing process, and further deposits silicon oxide on the silicon thermal oxide film having the Si microcrystal by the CVD (Chemical Vapor Deposition) method (refer to, for example, JP 2000-22005 A).

There is another proposed method for forming particles in which a thin film is formed on a substrate by using CVD, vapor deposition, MBE or another method and thereafter this thin film is micropatterned by using a fine processing technique of photolithography, etching or the like. According to such a method, an insulator layer is formed on the particles formed.

There is still another proposed method for forming particles, in which metal ions are implanted into an insulation film by ion implantation and the implanted ions are gathered by heat treatment for the formation of metal particles.

However, the method of forming the Si microcrystals on the silicon thermal oxide film through the annealing process has a problem that the manufacturing takes much time and labor since the process of depositing the silicon thermal oxide film is repeated. Moreover, the Si particles are formed only on one plane by one process. Accordingly, there is a problem that in order to increase the area density of the Si particles, a number of repetitions of the process steps from the step of depositing the silicon thermal oxide film to the annealing step are required, which increases the time and labor of the manufacturing.

Moreover, the aforementioned method of using the fine processing technique such as etching or the like has a problem that it is extremely difficult to concurrently reduce the size of the particles and the distance between the particles to the nanometer order.

On the other hand, according to the method of forming the conductive particles in the insulator by the ion implantation method, nanometer-size particles can be comparatively easily formed in an isolated state in the insulator. However, when the particles are formed by the ion implantation method, a number of interface states are formed at the interfaces between the particles and the insulator. Therefore, if a memory function body is formed by employing an insulator containing such particles, then the leakage of electric charges retained by the particles easily occurs, and a variation in the retention characteristic of electric charges of the particles is caused. Accordingly, there is a problem that a memory function body of excellent characteristics cannot stably be obtained.

SUMMARY OF THE INVENTION

Accordingly, an object of the present invention is to provide a memory function body capable of obtaining excellent characteristics and a particle forming method capable of stably obtaining a particle or particles of excellent characteristics with comparatively little time and labor.

In order to accomplish the above object, a memory function body according to one aspect of the present invention includes a first conductor and a second conductor, a medium that is formed between the first conductor and the second conductor and made of a first material, and at least one particle that is formed in the medium, covered with a second material, and made of a third material. The second material is a material that functions as a barrier against passage of electric charges, and the third material is a material that has a function to retain electric charges.

In the memory function body of the above-mentioned construction, the particle(s) formed of the third material is(are) covered with the second material. Therefore, the migration of electric charges between the particle(s) and the medium of the first material is restrained. Therefore, fluctuation in electric charges retained in the particle is restrained for a long time. Therefore, the memory function of this memory function body is kept stable for a long time.

In the present specification, the term "conductor" or "conductive substance" includes metals and semiconductors and also includes organic substances so long as they have conductivity. Moreover, the "particle" dealt with herein indicates a particle having a particle size (diameter) of smaller than 1 μm.

In one embodiment, the first material and the second material are different insulators, and the third material is a conductor.

Since the first material and the second material are mutually different insulators in this embodiment, the inflow and/or outflow of electric charges into or from the particle(s) is effectively restrained. Moreover, since the third material that forms the particle(s) is a conductor, an amount of retention of electric charges per unit volume can be increased. Therefore, even if there is some change in the amount of retained electric charges, the ratio of change with respect to the total amount of retained electric charges is reduced. Therefore, the memory function body can obtain a stable characteristic.

In one embodiment, the second material is a material obtained by making the third material insulative.

Since the second material is obtained by making the third material insulative in this embodiment, the interface between the second material and the third material is in a satisfactory state in which there are a comparatively small number of interface states. Therefore, the particle(s) constructed of the third material suffers(suffer) from less leakage of the retained electric charges than ever before. As a result, a memory function body capable of retaining electric charges for a longer time than ever before.

In the present specification, the term "insulation" or "make insulative" means changing a substance that has electrical conductivity to a substance that has substantially no electrical conductivity.

In one embodiment, the second material is a material obtained by oxidizing or nitriding the third material.

Because the second material is obtained by oxidizing or nitriding the third material in this mentioned embodiment, this memory function body can be manufactured by means of an existing oxidation furnace or the like widely used in the semiconductor industry. This therefore obviates the need for new manufacturing equipment specialized for the memory function body so that a minimum investment in equipment is required, which results in the obtainment of an inexpensive memory function body.

In one embodiment, the first material is a silicon oxide or a silicon nitride, the second material is a semiconductor oxide or a metal oxide, and the third material is a semiconductor or a metal.

In this embodiment, any of the first, second, and third materials are available by using existing equipment conventionally used in the semiconductor industry. Therefore, a high reliability memory function body is achievable at low costs.

In one embodiment, the second material is aluminum oxide, and the third material is aluminum.

In this embodiment, the particle(s) constructed of aluminum is(are) covered with aluminum oxide that is a dense, firm insulator. Therefore, the leakage of the retained electric charges from the particle is effectively prevented, and the retention state of the electric charges is stably maintained. Therefore, the memory function body has satisfactory reliability.

In one embodiment, the first conductor is a silicon substrate, and the medium is silicon oxide or silicon nitride. Therefore, the memory function body can be manufactured easily at low cost by an existing semiconductor manufacturing equipment. Moreover, because the memory function body can easily be combined with another element, versatility and practicability are obtained.

A particle forming method according to a second aspect of the present invention includes:

implanting a substance for forming one or more particles into an insulator by an ion implantation method;

forming conductive particles from the substance implanted in the insulator; and making the conductive particles insulative at a periphery thereof.

In the above-mentioned construction, a large amount of the substance is implanted at one time into the insulator by the ion implantation method. A number of conductive particles are formed in the insulator. Then, the periphery of each of the conductive particles is made insulative.

Since the substance for forming the conductor particles is introduced into the insulator by using the ion implantation method according to this method, it is easy to form the particles so as to be distributed in the thickness direction of the insulator in comparison with the implantation by the CVD method. Therefore, the density of the particles can be increased, and a processing time for forming the conductor particles can be shortened, as compared the implantation by the CVD method.

Therefore, a large number of conductive particles can be formed in the insulator through a small number of process steps. Moreover, since the periphery of the conductive particle is made insulative, the periphery of the conductive particle has a satisfactory state having few interface states. Therefore, the conductive particles formed by the method of the present embodiment can stably retain electric charges for a long time with little leakage thereof.

In diffusing ions of the substance into the insulator by the ion implantation method, conductive particles may be spontaneously formed under some implantation conditions even if, for example, a heat treatment process or the like for forming the conductive particles is not separately carried out. That is, the conductive particles may be obtained only through the implantation process using the ion implantation method, in which case the process for implanting the substance by the ion implantation method concurrently serves as a process for forming the conductive particle. Moreover, in some cases, a heat treatment effect is obtained when, for example, heat is applied during the process for making the periphery of the conductive particle insulative. In such a case, the insulation process can concurrently serve as the process for forming conductive particles.

In one embodiment, the substance for forming conductive particles is implanted into the insulator from a direction that makes an acute angle with respect to a surface of the insulator.

In this embodiment, because the substance is implanted from the direction that makes an acute angle with the surface of the insulator, conductive particles are formed in a shallow position of the insulator. Moreover, the conductive particles are formed throughout a range of comparatively small depth of the insulator. Therefore, the first insulator can be formed into a thin film.

In one embodiment, the particle forming method includes ionizing the substance to be implanted into the insulator for forming the conductive particles into negative ions.

Since the substance for forming the conductive particles is in the form of negative ions in the above-mentioned embodiment, it is possible to prevent the insulator subjected to the implantation and a conductor (substrate and so on) placed in contact with this insulator from being electrically charged with a high voltage, dissimilarly to a case where the substance for forming the particles is implanted in the form of positive ions. Therefore, the implantation energy can be accurately controlled, and the variation in the implantation depth of the substance is prevented. Moreover, the occurrence of defects in the insulator or the like, in which the substance is implanted, is effectively prevented.

In one embodiment, after implanting the substance for forming one or more conductive particles into the insulator by the ion implantation method, the particle forming method further includes etching the insulator from a top surface to a prescribed depth.

In this embodiment, a portion ranging from the surface to the prescribed depth and having a comparatively low concentration of implantation of the substance is removed from the insulator by etching. Therefore, the insulator is formed into a thin film, and as a result the density of conductive particles in the insulator can be increased.

A particle forming method according to a third aspect of the present invention includes:

diffusing a substance for forming one or more conductive particles into an insulator by a solid phase diffusion method;

forming conductive particles from the substance diffused in the insulator; and making the conductive particles insulative at a periphery thereof.

In the above construction, a large amount of substance for forming the conductive particles diffuses in the insulator through a small number of process steps by the solid phase diffusion method. Moreover, the solid phase diffusion method can be carried out by a comparatively simple apparatus. Therefore, a large number of conductive particles are comparatively readily formed in the insulator. Moreover, since the periphery of the conductive particles is made insulative, the periphery of the conductive particles has a satisfactory state having few interface states. Therefore, once electric charges are stored in conductive particles, leakage of the electric charges therefrom is effectively prevented, so that the electric charges are stably kept in the conductive particles for a long time.

In diffusing the substance into the insulator by the solid phase diffusion method, conductive particles may be spontaneously formed under some diffusion conditions even if, for example, a heat treatment process or the like for forming the conductive particles is not separately carried out. If the thus formed conductive particles satisfy the requirements, the process for diffusing the substance by the solid phase diffusion method concurrently serves as the process for forming the conductive particles. Moreover, in some cases, a heat treatment effect is obtained when, for example, heat is applied during the process for making the periphery of the conductive particles insulative. In such a case, the insulation process can concurrently serve as the process for forming the conductive particles.

In one embodiment, the step of making the conductive particles insulative at a periphery thereof comprises oxidizing or nitriding the periphery of each conductive particle.

In this embodiment, the periphery of the conductive particles is oxidized or nitrided to become insulative by using an existing semiconductor manufacturing equipment. Therefore, the particles can be made insulative at low cost.

A particle forming method according to a further aspect of the present invention includes:

forming an insulator on a semiconductor substrate;

implanting a substance that contains a conductive element into the insulator by a negative ion implantation method; and subjecting the insulator, in which said substance has been implanted, to heat treatment in an oxidizing atmosphere or a nitriding atmosphere.

According to the above construction, the processes other than the process that uses the negative ion implantation method can be carried out by an existing semiconductor manufacturing equipment. Moreover, the negative ion implantation method can be carried out by somewhat changing an existing ion implanter. Therefore, according to the present embodiment, the particles can be manufactured at low cost. Moreover, it is possible to incorporate the particles in a semiconductor device by using an existing semiconductor manufacturing equipment, and this is practical.

A memory device according to the present invention has a field-effect type transistor formed by employing the aforementioned memory function body.

With the construction, it is possible to realize a nonvolatile memory device that has high mass-productivity and an excellent leakage tolerance and that is able to be miniaturized.

A semiconductor device of the present invention has a memory circuit in which the aforementioned memory devices are integrated.

With the construction, because the memory devices can easily be miniaturized, it is possible to reduce the occupation area of the memory circuit and hence effectively downsize the semiconductor device.

Electronic equipment of the present invention incorporates the above-mentioned semiconductor device.

This electronic equipment can be downsized since it is provided with the compact semiconductor device in which the occupation area of the memory circuit is small.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Figure 1A:
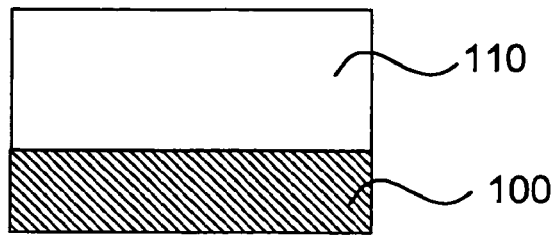
FIGS. 1A through 1D are process charts showing a particle forming method according to a first embodiment of the present invention.

The present invention will be described in detail below on the basis of the embodiments shown in the drawings.

(First Embodiment)

FIGS. 1A through 1E are process charts showing a particle manufacturing method according to a first embodiment of the present invention. In the present embodiment, silver particles as conductive particles are formed in a silicon oxide film that serves as an insulator.

First, as shown in FIG. 1A, a silicon oxide film 110 that serves as an insulator is formed on a top surface of a silicon substrate 100 that serves as a semiconductor substrate through a thermal oxidation process. In the present embodiment, the film is formed to a film thickness of about 50 nm.

Figure 1B:
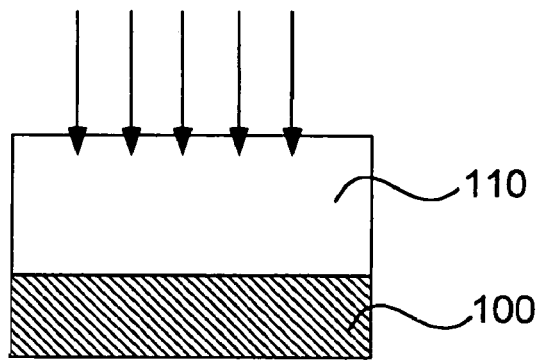

Next, as shown in FIG. 1B, silver as a substance for forming conductive particles is introduced into the silicon oxide film 110 by the ion implantation method. At this time, the distribution of implantation tends to expand excessively if implantation energy is extremely high. Thus, such a high implantation energy is not suitable for the implantation into the comparatively thin silicon oxide film 110 because it will, disadvantageously, cause damage and hence a defect to the silicon oxide film 110. Therefore, the implantation energy should preferably be smaller than 100 KeV and should more particularly be smaller than 50 KeV. In the present embodiment, the implantation was carried out with energy of about 30 KeV so as to form the particles in the vicinity of the center in the thickness direction of the silicon oxide film 110.

Moreover, if the dose of implantation is extremely large, the particle diameter will become extremely large and the degree of damage to the silicon film 110 will be increased. If, however, the dose of implantation is extremely small, the density of the particles will become too small. Therefore, the dose of implantation should preferably be greater than $1\times10^{12}/cm^2$ and smaller than $1\times10^{20}/cm^2$. For example, the dose of implantation should more preferably be greater than $1\times10^{13}/cm^2$ and smaller than $1\times10^{17}/cm^2$. In the present embodiment, silver ions were introduced with energy of about 30 KeV and a dose of about $1\times10^{15}/cm^2$. The above dose of silver ions was injected at a time, but may be given in several injections. In such a time, those injections are performed such that a total amount of doses falls in the above-described range. This is true of other embodiments described later.

Needless to say, the energy of implantation and the dose of implantation differ depending on the ionic species.

Moreover, the ion implantation method for implanting silver may preferably be a negative ion implantation method. When the implantation is carried out by using negative ions, the surface potential of the insulator (silicon oxide film 110 in the present embodiment) subjected to the implantation does not rise to a voltage close to the acceleration voltage of positive ions, to which the surface potential of the insulator would rise if positive ions were employed, so that the surface potential of the insulator is able to be suppressed to a very low value of about several volts. That is, according to the positive ion implantation method, when the ions of the positive charges are injected into the surface of the insulator, secondary electrons of negative charges are discharged. Therefore, the surface of the insulator keeps being positively charged, and the surface potential eventually rises to the acceleration voltage of the positive ions. In the case of the negative ion implantation method, secondary electrons of negative charges are discharged as a consequence of the injection of ions of negative charges, and the surface potential settles between about positive and negative several volts. Accordingly, the fluctuation in the effective acceleration voltage becomes reduced in comparison with the positive ion implantation, and therefore, it becomes possible to restrain the variation in the implantation depth of the substance (silver) for forming the conductive particles. Moreover, since the insulator is scarcely electrically charged, it becomes possible to restrain the occurrence of defects due to dielectric breakdown and the like. In the present embodiment, a negative ion implantation apparatus produced by Nissin Electric CO., Ltd. was used.

Figure 1C:
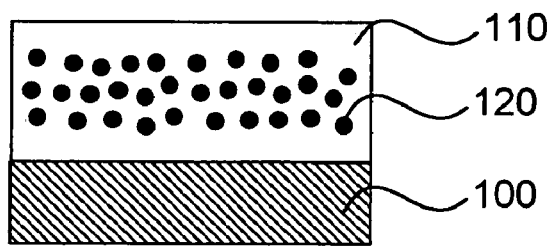

Subsequently, the silicon oxide film 110, in which silver has been implanted, is subjected to heat treatment. By gathering or diffusing the implanted element (silver) ions by this heat treatment, silver particles 120 of a prescribed particle diameter are formed as shown in FIG. 1C. It is also possible to repair the defect of the silicon oxide film 110 generated during the ion implantation. The heat treatment takes no effect when the temperature for the heat treatment is excessively low, while the particles cannot be formed as a consequence of the diffusion and melting of the implanted element when the temperature is excessively high. Therefore, the temperature of the heat treatment should preferably be higher than 200° C. and lower than the melting point of the implanted element (silver), although this is not true of a case in which a high temperature heat treatment is performed for a short time as in an RTA (rapid thermal annealing) process. In such a case, the temperature of the heat treatment may exceed the melting point of the implanted element. Note that the "short time" here is defined as a time shorter than one hour. The effect at a temperature is increased if the processing time is protracted even at the same temperature. However, if the processing time is too long, the particle diameter of the particles may become too large or the implanted element may diffuse outwardly of a region where the particles should be formed, and therefore, the processing time should preferably be shorter than 24 hours.

Generally, heat treatments are carried out in an inert atmosphere of argon or the like, but the heat treatment according to the present invention is carried out in an atmosphere in which the periphery of each conductive particle is made insulative. In the present embodiment, the heat treatment is carried out in a vapor phase including oxygen to form silver particles. Further, oxygen atoms are diffused in the silicon oxide film 110 to thereby supply the oxygen to the periphery of each of the silver particles, whereby the periphery of each silver particle is oxidized and made insulative.

Conditions of the heat treatment, such as the temperature, time, flow rate in the vapor phase, and so on, differ depending on the material to be employed, the desired particle diameter and the thickness of the insulation layer formed around the periphery of the particle.

Figure 1D:
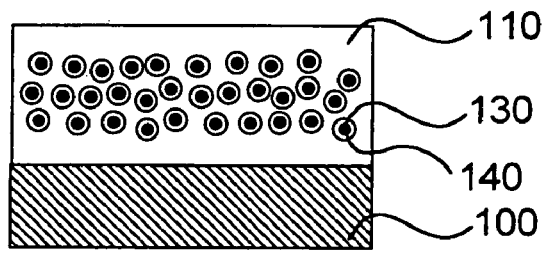

In the present embodiment, the heat treatment is carried out in an oxidizing atmosphere for about several hours at a temperature slightly lower than that for the silicon thermal oxidation. Through this process, the silver particle 120 is made insulative by forming silver oxide 140 at the periphery thereof as shown in FIG. 1D.

During the above-mentioned heat treatment, it is also possible to achieve insulation by nitridation, instead of oxidation. For example, by implanting silicon as a metal element for forming conductive particles and thereafter carrying out heat treatment in an ammonia atmosphere, a silicon nitride is formed as an insulator around the periphery of each of the particles.

Moreover, it is also acceptable to initially carry out heat treatment in an inert atmosphere of argon, nitrogen, or the like in which conductive particles are formed to a certain extent, and thereafter change the heat treatment to a new heat treatment in an atmosphere in which the formed conductive particles are insulated. According to this method, the conductive particles can be made insulative after the size of the particles is adjusted to the desired size. Therefore, particles having a variety of particle diameters can be accurately formed. For example, when an ordinary heat treatment furnace is used, it is preferable to carry out initial heat treatment at a temperature of about 300° C. to 900° C. in an inert atmosphere of argon, nitrogen or the like. For example, the heat treatment can be effected for about one hour in the argon atmosphere by means of a ceramics electric tube furnace made by Asahi Rika, CO., Ltd. This is, of course, intended for the silver particles, and the optimum heat treatment condition differs depending on the element for forming the conductive particles.

Further, when the heat treatment for forming the conductive particles is carried out at a comparatively low temperature, it is preferable to carry out the heat treatment at a temperature of about 500 to 1000° C. in order to repair the defects generated in the insulator by implantation. At this time, if the heat treatment is effected for a long time, fusion, diffusion or the like of the conductive particles will occur. Therefore, it is preferable to carry out RTA (Rapid Thermal Annealing), i.e., heat treatment for a short time.

Figure 1E:
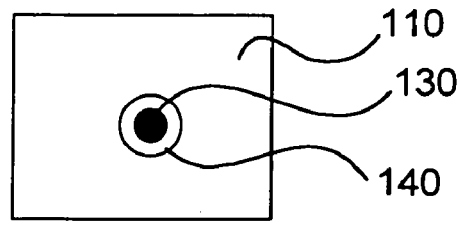
FIG. 1E is an enlarged view of part of FIG. 1D.

The conductive particles formed by the particle forming method of the present embodiment were examined by cross-sectional TEM (Transmission Electron Microscope) observation. According to the observation results, as shown in FIG. 1D, the so called nanometer-size silver particles 130 having a particle size (diameter) of about 2 to 3 nm were formed as a consequence of the cohesion of the implanted silver ions. Further, silver oxide 140 was formed so as to cover the silver particles 130. The silver particles 130 formed were distributed accurately at a depth expected from the acceleration energy of the silver ions. FIG. 1E is an enlarged view of part of FIG. 1D.

As described above, the negative ion implantation method, which can restrain the electric charging effect of the insulator subjected to the implantation, therefore has the advantage that it is easy to carry out implantation to the intended depth and concentration in the insulator. Moreover, the substance for forming the particles is introduced into the insulator by implantation, and therefore, the nanometer-size particles distributed in appropriate positions in the insulator can be formed through a single process. Accordingly, there is no need to repeat again and again the thin film formation process and the fine processing process of this thin film, dissimilarly from the conventional case. Moreover, there is no need to use the nanoscale fine processing technique, and therefore, productivity is good.

Although the silver is employed as the particle material in the present embodiment, it is acceptable to employ a conductor of a metal such as gold or copper, or a semiconductor such as silicon or germanium, although gold is hardly oxidized, and it is therefore more or less difficult to insulate the periphery of each particle. From the viewpoint of the stable formation of the insulator that covers the particles, it is preferable to employ a substance, such as, for example, aluminum, that forms a strong oxide film on its surface through oxidation. Besides aluminum, tungsten, niobium, zirconium, titanium, chromium, tin, cobalt, nickel, iron, antimony, lead and so on are also preferable.

Moreover, although the thermal oxide film on the silicon substrate has been taken as an example of the insulator in which the particles are to be formed, it is also possible to employ another insulator such as a glass substrate or the like. A semiconductor substrate may be also used.

(Second Embodiment)

In a particle forming method of a second embodiment, an etching process is further provided between the particle forming process and the insulation process as carried out in the particle forming method of the first embodiment, so that a region from the top surface of the insulator in which the particles have been formed to the prescribed depth is removed.

In the present embodiment, silver particles are formed as conductive particles similarly to the first embodiment.

Figure 2A:
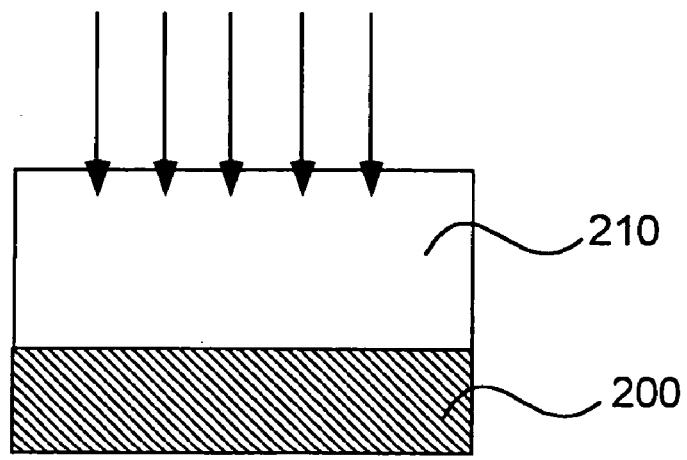
FIGS. 2A through 2D are process charts showing a particle forming method according to a second embodiment.

First, as shown in FIG. 2A, a silicon oxide film 210 that serves as an insulator is formed on a top surface of a silicon substrate 200 that serves as a semiconductor substrate through a thermal oxidation process. In the present embodiment, the film is formed to a film thickness of about 100 nm.

Figure 2B:
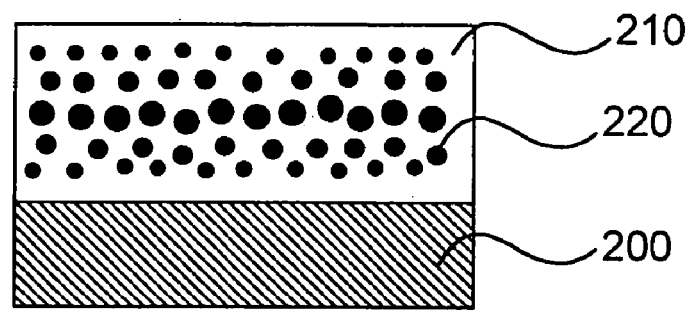

Next, as shown in FIG. 2B, silver is introduced into the silicon oxide film 210 by the ion implantation method. In this case, the implantation energy is set so that the implantation depth becomes about 50 nm.

Normally, the ion implantation method causes a distribution of implantation, and the concentration of the implanted substance has a concentration profile similar to the Gaussian distribution in the depthwise direction with a maximum concentration at a prescribed depth. In the present embodiment, the implanted silver ions have a maximum concentration at the depth of about 50 nm from the surface. Therefore, when conductive particles are formed similarly to the first embodiment, the conductive particles form a particle diameter distribution that depends on the ion concentration. That is, particles of comparatively large particle diameters are formed at the depth corresponding the maximum implantation concentration, and particles of comparatively small particle diameters are formed above and below the position in which the particles of the comparatively large particle diameters are formed.

Figure 2C:
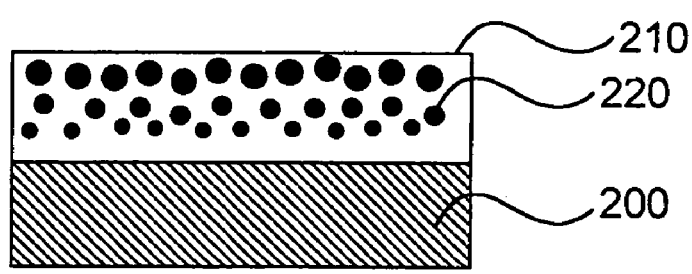

Then, in the present embodiment, an upper part of the insulator (silicon oxide film 210) from the top surface to a prescribed depth is removed by etching. Through this process, as shown in FIG. 2C, the particles of comparatively large particle diameters are positioned near the surface of the insulator and the particle size is reduced as going from the neighborhood of the insulator surface toward the substrate side. In the etching process for removing the part of the insulator, either wet etching or dry etching can be used. Since the insulator was silicon oxide in the present embodiment, the wet etching was carried out by using a hydrofluoric acid solution of a concentration of 0.5%.

The thickness of the part of the insulator to be removed by the etching process is set equivalent to or greater than the implantation depth of the substance for forming the particles in this insulator. In the present embodiment, etching was effected to a depth of about 50 nm from the surface.

Figure 2D:
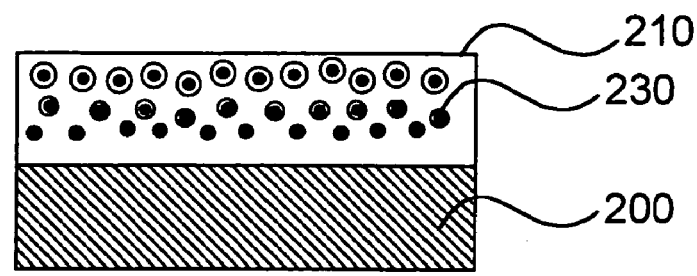

Thereafter, similarly to the first embodiment, the conductive particles are made insulative at the periphery thereof by, for example, thermal oxidation. Through this process, silver oxide is formed around the periphery of each silver particle 230, as shown in FIG. 2D. In this insulation process, a load-lock type oxidation furnace produced by Hitachi Kokusai Electric Inc. was used. The silver particles undergo a greater degree of oxidation as located closer to the surface of the silicon oxide film 210, whereas the silver particles have greater particle diameters as located closer to the surface. Therefore, the silver particles 230 after subjected to the insulation process have a comparatively smaller variation in the particle diameter in the depth direction than the silver particles 220 before subjected to the insulation process.

(Third Embodiment)

In a third embodiment, an etching process is provided between an ion implantation process and a heat treatment process, and a region from a surface to a prescribed depth is removed from an insulator in which a substance for forming conductive particles has been implanted.

In the present embodiment, silver particles that serve as conductive particles are formed in a silicon oxide film that serves as an insulator.

First, a silicon oxide film 310 as an insulator is formed on a surface of a silicon substrate 300 as a semiconductor substrate through a thermal oxidation process. In the present embodiment, the film is formed to a film thickness of about 100 nm.

Figure 3A:
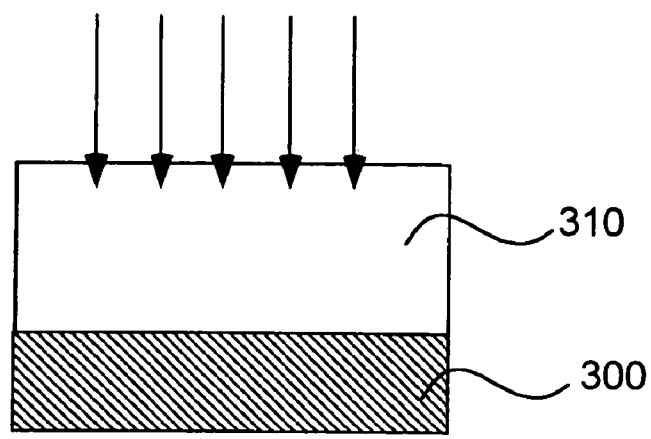
FIGS. 3A through 3D are process charts showing a particle forming method according to a third embodiment.

Next, as shown in FIG. 3A, silver is introduced into the silicon oxide film 310 by the ion implantation method. In this case, the implantation energy is set so that the implantation depth becomes about 50 nm.

In this case, the implantation concentration of silver ions forms a concentration profile similar to the Gaussian distribution in the depth direction with a maximum concentration located in a region at a depth of about 50 nm from the surface of the silicon oxide film 310.

Figure 3B:
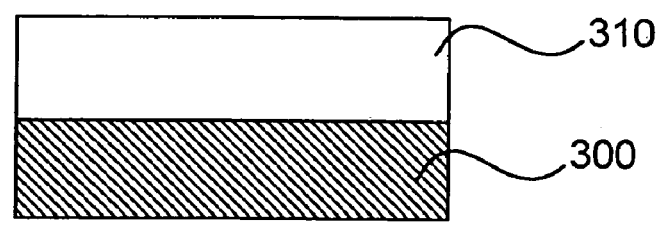

Subsequently, as shown in FIG. 3B, a surface portion of the silicon oxide film 310 is removed by etching so that the portion of a high implantation concentration of silver becomes located near a top surface. That is, the silicon oxide film 310 is etched to a depth equivalent to or deeper than the above-mentioned implantation depth. In the present embodiment, the etching was effected to a depth of about 50 nm from the surface. The etching method may be either one of wet etching or dry etching similarly to the second embodiment. In the present embodiment, the wet etching was carried out by using a hydrofluoric acid solution of a concentration of 0.5%.

Subsequently, heat treatment of the silicon oxide film 310 and the insulation process for silver particles are carried out similarly to the second embodiment.

Figure 3C:
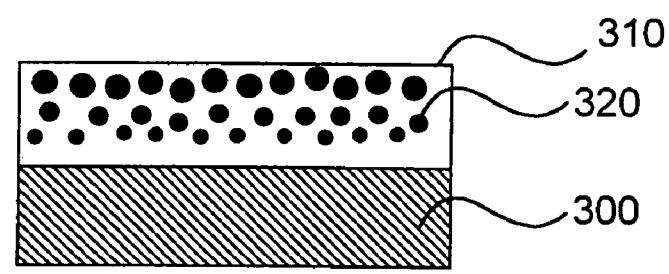

First, the heat treatment of the silicon oxide film 310 is carried out so that as shown in FIG. 3C, silver particles 320 are distributed in such a manner that the particle diameter thereof reduces as going from the neighborhood of the surface of the silicon oxide film 310 toward the substrate 300 side.

Figure 3D:
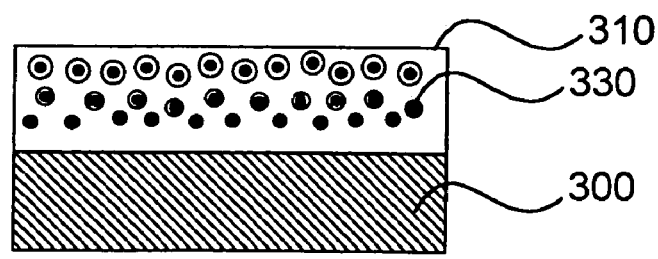

Then, the periphery, or surface portions of the silver particles were made insulative through thermal oxidation. In the present embodiment, the load-lock type oxidation furnace produced by Hitachi Kokusai Electric Inc. was used. As a result, as shown in FIG. 3D, a silver oxide film was formed around the periphery of each of silver particles 330. A comparatively thick silver oxide film was formed on the particles located near the surface of the silicon oxide film 310. On the other hand, a comparatively thin silver oxide film was formed on the silver particles 330 located on the silicon substrate 300 side, i.e., remote from the surface of the silicon oxide film 310. Consequently, the silver particles 330 after insulation came to have an approximately equal particle diameter in the thickness direction of the silicon oxide film 310. As a result, the silver particles 330, which remained uninsulated in the center portion of the initially formed silver particles 320, had a particle diameter distribution of less variation than that of the initially formed silver particles 320.

In the first through third embodiments, the implantation process, the heat treatment process and the insulation process were independently carried out. However, even immediately after the ion implantation, the particles can be formed without carrying out the heat treatment process, under certain implantation conditions. Moreover, the insulation process is a process accompanied by heat like, for example, the thermal oxidation process. Therefore, the insulation process can also serve as a heat treatment process.

In that case, however, the conditions for obtaining the desired particles become severe, or the process tends to become unstable. Therefore, it is preferable to separate the processes in carrying out mass-production.

(Fourth Embodiment)

In a fourth embodiment, a substance for forming conductive particles is implanted into a semiconductor substrate, and thereafter, an oxidation process of the semiconductor substrate is carried out. The process of oxidizing this semiconductor substrate is carried out so as to effect oxidation until a region where the implantation concentration of the substance is high is reached. Subsequent to this semiconductor substrate oxidizing process, etching is carried out by, for example, dilute hydrofluoric acid, to remove the oxidized region. At this point of time, the portion where the implantation concentration of the substance is high appears in the surface. Then, the semiconductor substrate, in the surface of which the portion of a high implantation concentration has appeared, is heat-treated to diffuse or gather the implanted substance that is a metal. Desired particles are formed at this point of time. Subsequently, oxidation is carried out again to oxidize the surface portion of the semiconductor substrate, and the periphery of each of the conductive particles is oxidized for the insulation of the particles.

FIGS. 4A through 4D are views for explaining the method for forming the silver particles in the silicon oxide film similarly to the aforementioned embodiments.

Figure 4A:
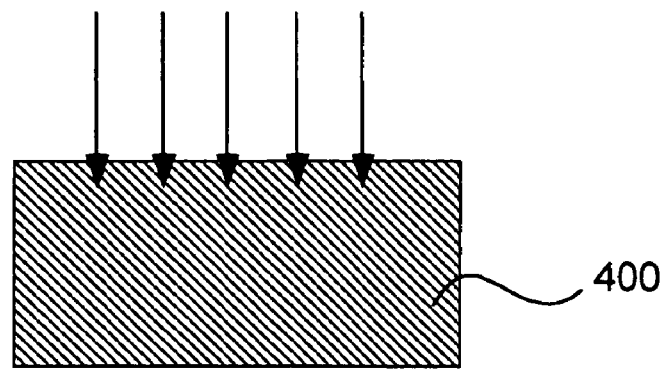
FIGS. 4A through 4D are process charts showing a particle forming method according to a fourth embodiment.

In the present embodiment, the silver ion implantation is carried out in a state in which no silicon oxide film exists on the silicon substrate or through a thin pad film, dissimilarly from the first through third embodiments. That is, as shown in FIG. 4A, silver ions are introduced into a silicon substrate 400 by the ion implantation method. In this case, the implantation energy is set so that the implantation depth of the silver ions becomes about 50 nm.

Even in this case, the implantation concentration of silver ions becomes a profile similar to the Gaussian distribution in which a position at the depth of about 50 nm from the surface of the silicon substrate 400 has a maximum concentration in the depth direction, similarly to the aforementioned embodiments.

Figure 4B:
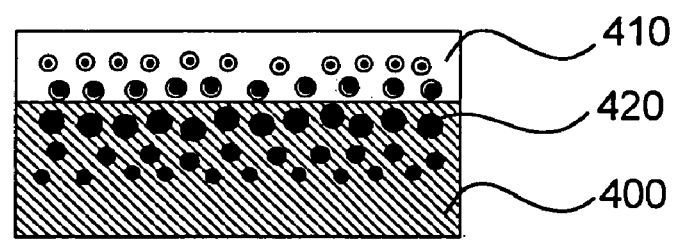

Subsequently, an oxidation process is carried out. That is, as shown in FIG. 4B, the silicon substrate 400 is oxidized to form a silicon oxide film 410. The oxidation is carried out so that a portion of a high implantation concentration of silver is positioned in the vicinity of the interface between this silicon oxide film 410 and the silicon substrate 400. That is, the oxidation depth of the silicon substrate 400 is made roughly equivalent to or greater than the implantation depth of silver. In the present embodiment, the oxidation was effected from the surface of the initial silicon substrate to a depth of about 50 nm. By heat when this oxidation is carried out, silver particles 420 are formed.

Figure 4C:
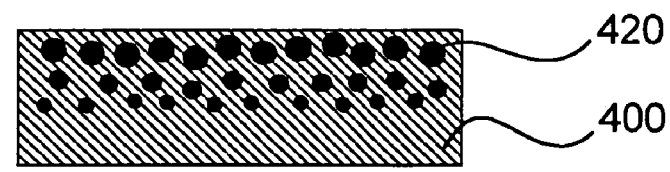

Next, the silicon oxide film 410 is removed. In the present embodiment, the silicon oxide film 410 is removed by dilute hydrofluoric acid. Consequently, as shown in FIG. 4C, a distribution of silver particles 420 is obtained, in which silver particles 420 having a maximum particle diameter are located near the surface of the silicon substrate 400 and silver particles 420 having a decreasing particle diameter are located farther in the depth direction from the surface of the silicon substrate 400.

Figure 4D:
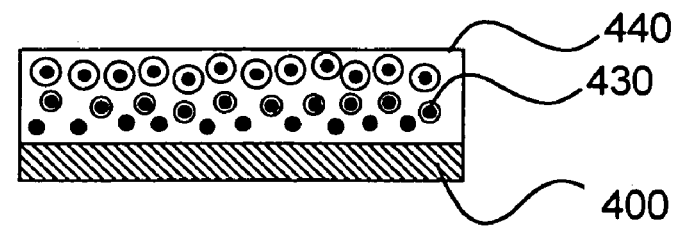

Subsequently, the silicon substrate 400 is oxidized again. This oxidation was carried out by the thermal oxidation method, by which a silicon oxide film 440 of a film thickness of about 50 nm was formed on the surface of the silicon substrate 400. Consequently, as shown in FIG. 4D, the surface portions of the silver particles 420 were also oxidized, so that silver particles 430 of which the surfaces were covered with silver oxide were formed. The particle diameters of the silver particles 430, of which the surfaces were covered with silver oxide, had a comparatively smaller variation than the particle diameter of the silver particle 420 before the formation of silver oxide, similarly to the third embodiment.

(Fifth Embodiment)

In a fifth embodiment, a pad oxide film is preliminarily formed on a semiconductor substrate to be subjected to implantation of a substance for forming conductive particles prior to the implantation of this substance.

Next, the substance is implanted through the pad oxide film. At this time, the thickness of the pad oxide film and the implantation condition are set so that the implanted substance is located at a higher implantation concentration at an interface between the pad oxide film and the semiconductor substrate.

Heat treatment is carried out after the implantation of the substance, thus forming conductive particles. Subsequently, the pad oxide film is etched by, for example, dilute hydrofluoric acid.

Next, an oxidation process is carried out again for oxidization of the surface portion of the semiconductor substrate as well as for insulation by oxidation of the conductor particles at their peripheries. The conductive particles undergo a greater degree of oxidation according as they are located closer to the top surface of the semiconductor substrate, whereas the conductive particles near the surface of the semiconductor substrate have a comparatively great particle diameter. Therefore, the conductive particles after insulation come to have a comparatively smaller variation in the diameter in the depth direction of the semiconductor substrate.

A concrete example of the present embodiment will be described with reference to FIGS. 5A through 5D.

First, a silicon oxide film 510 is formed as a pad oxide film on the surface of a silicon substrate 500 that serves as a semiconductor substrate through a thermal oxidation process. This silicon oxide film 510 was formed to a thickness of about 25 nm.

Figure 5A:
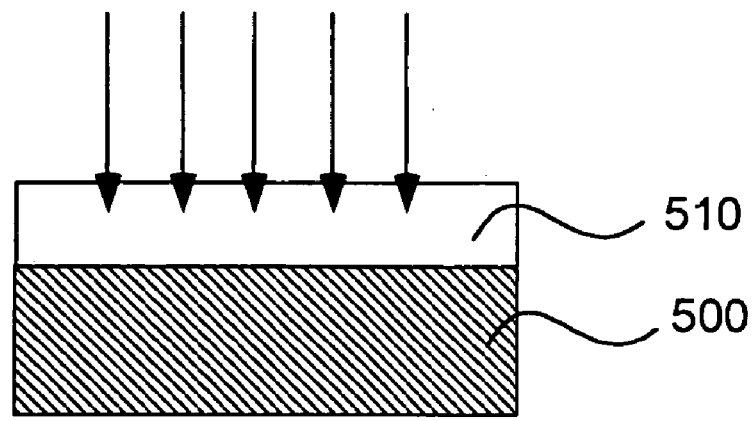
FIGS. 5A through 5D are process charts showing a particle forming method according to a fifth embodiment.

Next, as shown in FIG. 5A, silver is introduced into the silicon oxide film 510 and the silicon substrate 500 by the ion implantation method. In this case, the implantation energy is set so that the implantation depth of silver ions becomes located in the vicinity of the interface between the silicon oxide film 510 and the silicon substrate 500. In the present example, the implantation was carried out so that the implantation depth became about 50 nm.

Also, in the present example as well, the implantation concentration of silver ions has a concentration profile similar to the Gaussian distribution in the depthwise direction, with a maximum concentration located at a depth of about 50 nm from the surface of the silicon oxide film 510.

Figure 5B:
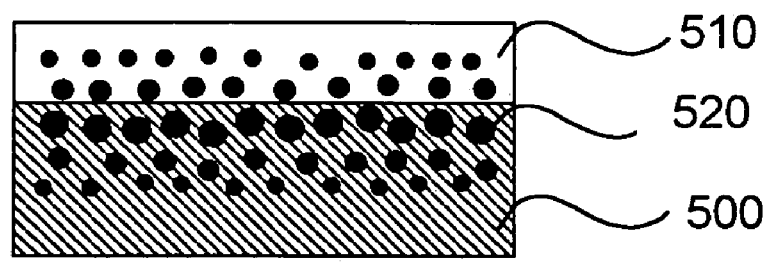

Next, a heat treatment process is carried out to form silver particles 520. In the silicon oxide film 510 and the silicon substrate 500, the particle diameter distributions depending on the ion concentrations are provided in the respective base materials as shown in FIG. 5B although the state of formation of the particles differs between the silicon oxide film 510 and the silver particle 520 due to the difference between the base materials.

Figure 5C:
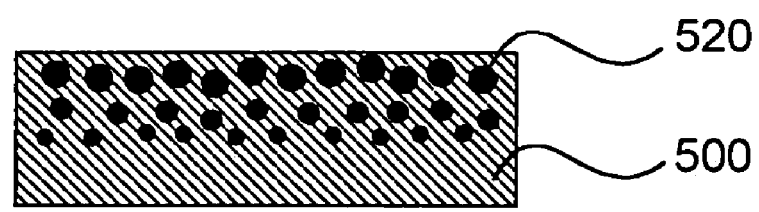
Figure 5D:
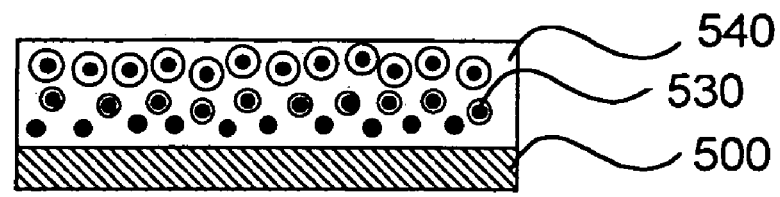

Then, the silicon oxide film 510 that serves as the pad oxide film is removed by oxide film etching technique. The removal of the silicon oxide film 510 results in the obtainment of silver particles 520 that are distributed in such a manner that the particle diameter thereof becomes smaller as going in the depth direction farther from the surface of the silicon substrate 500, as shown in FIG. 5C. As the etching technique, either of wet etching and dry etching can be used. In the present example, the wet etching was carried out with a hydrofluoric acid solution of a concentration of 0.5%.

Subsequently, similarly to the fourth embodiment, the oxidation of the silicon substrate 500 and the insulation of the particles are carried out through a thermal oxidation process. In this process, a load-lock type oxidation furnace produced by Hitachi Kokusai Electric Inc. was used. Through this thermal oxidation process, silver oxide was formed thicker on the silver particles 530 located near a top surface of an insulator 540 resulting from the oxidation of the silicon substrate 500. However, since the pre-insulation particles located near the surface of the insulator 540 had a greater particle diameter, the post-insulation silver particles 530 came to have a smaller variation in the particle diameter than pre-insulation silver particles 520.

The insulator, or oxide film 540 formed at the surface of the silicon substrate 500 through the thermal oxidation process was of a thickness of about 30 nm.

(Sixth Embodiment)

A sixth embodiment differs from the fifth embodiment in the sequence of the process of etching the pad oxide film and the heat treatment process.

That is, in the present embodiment, a substance for forming the particles is implanted via a pad oxide film, and thereafter, the pad oxide film is removed. Subsequently, heat treatment is carried out to form conductive particles. Subsequently, an oxidation process is carried out to oxidize the semiconductor substrate and oxidize the periphery of the conductive particles for the insulation purpose.

FIGS. 6A through 6D are views showing a method for forming silver particles as the conductive particles.

First, a silicon oxide film 610 that serves as a pad oxide film is formed at the surface of a silicon substrate 600 that serves as a semiconductor substrate, through a thermal oxidation process. In the present embodiment, the film was formed to a thickness of about 25 nm.

Figure 6A:
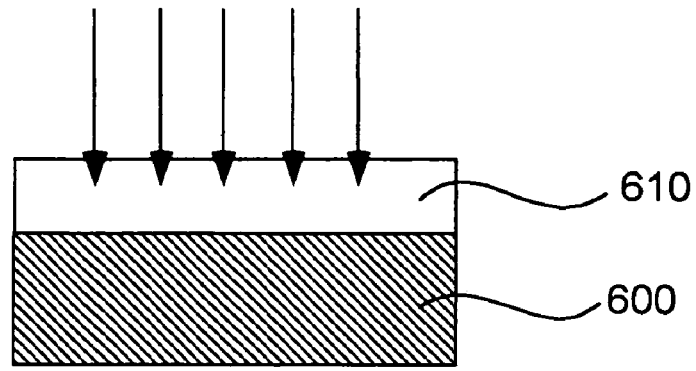
FIGS. 6A through 6D are process charts showing a particle forming method according to a sixth embodiment.

Next, as shown in FIG. 6A, silver is introduced into the silicon oxide film 610 and the silicon substrate 600 by the ion implantation method. In this case, the implantation energy is set so that a maximum implantation depth is located near the interface between the silicon oxide film 610 and the silicon substrate 600. In the present embodiment, the implantation depth was set to a depth of about 50 nm.

In the present embodiment, the implantation concentration of silver ions has a profile similar to the Gaussian distribution, with a maximum concentration being located at a depth of about 50 nm from the surface of the silicon oxide film 610.

Figure 6B:
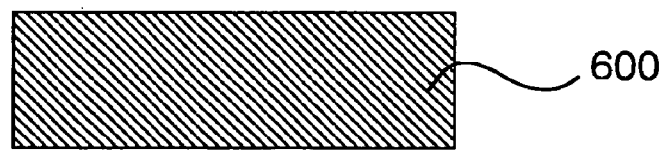

Next, as shown in FIG. 6B, the silicon oxide film 610 is removed by oxide film etching, and processing is carried out so that a portion of a high implantation concentration of silver ions becomes located near a top surface of the processed substrate. As the etching technique, either of wet etching and dry etching can be used. Since the pad film to be removed was silicon oxide in the present embodiment, the wet etching was carried out by using a hydrofluoric acid solution of a concentration of 0.5%.

Under some conditions, silver particles may be formed upon implantation of silver ions.

Subsequently, heat treatment and an oxidation process are carried out.

Figure 6C:
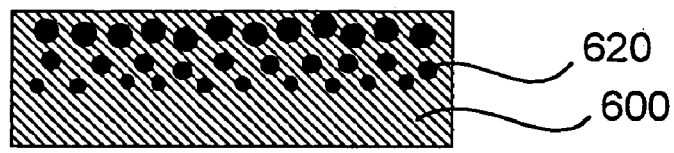

First, as shown in FIG. 6C, heat treatment is carried out to form particles 620 that are distributed in such a manner that the particle diameter thereof becomes smaller as going in the depth direction farther from the surface of the silicon substrate 600.

Figure 6D:
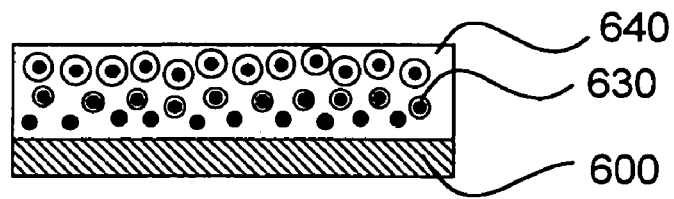

Then, the insulation process is carried out through thermal oxidation. In the present embodiment, a load-lock type oxidation furnace produced by Hitachi Kokusai Electric Inc. was used. Consequently, as shown in FIG. 6D, a silicon oxide film 640 of a thickness of about 30 nm is formed on the silicon substrate 600. Moreover, silver oxide is formed at the periphery of each of the silver particles 630, the thickness of which oxide is comparatively thick where the particles are located near the surface of the silicon oxide film 640, and the thickness of the silver oxide reduces as according the particles are located less closer to the surface of the silicon oxide film 640. As a result, the post-insulation silver particles 630 came to have a smaller variation in the particle diameter with respect to the depth direction of the silicon oxide film 640 than the pre-insulation silver particles 620.

In the first through sixth embodiments, silver is employed as the material of the conductive particles. However, it is acceptable to employ other metals such as gold, copper, aluminum, tin, nickel, platinum, zinc, hafnium, manganese, tantalum, titanium, tungsten and indium.

In particular, use of a substance that allows formation of a dense oxide film at a surface, such as aluminum, can make it possible to enclose a particle with an insulator of few defects. Therefore, when electric charges are retained in an aluminum particle, the leakage phenomenon of electric charges can effectively be restrained. Therefore, a memory function body with an excellent charge retention characteristic is achievable.

Moreover, it is also possible to employ a semiconductor such as silicon, germanium or the like, or a non-semiconductor alloy or compound for the conductive particles.

Particularly, when silicon is employed as the material of the conductive particle and this silicon particle is made insulative through oxidation or nitridation to form a silicon oxide film or a silicon nitride film on the surface of the silicon particle, the film can function as an effective barrier against electric charges retained in the silicon particle. That is, a memory function body that has an excellent retention characteristic almost free of leakage of electric charges is achievable.

(Seventh Embodiment)

In a seventh embodiment, in the process of introducing the material of conductive particles into the insulator by the ion implantation method in any of the aforementioned embodiments, the implantation is carried out from a direction that makes an acute angle with respect to the surface of the insulator.

In concrete, silver negative ions are implanted at an incident angle of about 70° with respect to a normal to a top surface of a silicon oxide film formed on a silicon substrate. The silicon oxide film has a thickness of about 100 nm. The implantation condition of the silver negative ions is roughly similar to the condition of the sixth embodiment.

Subsequently, silver particles are formed by carrying out a heat treatment process similarly to the sixth embodiment. The silver particles thus formed are distributed in a width narrower than in the sixth embodiment in the depthwise direction of the silicon oxide film. In the present embodiment, the silver particles were able to be formed in a region of a thickness of about half the thickness in the sixth embodiment.

Meanwhile, according to an implantation method employing positive ions, the insulator of the silicon oxide film or the like that undergoes the implantation is disadvantageously electrically charged, and it is often the case that the distribution of implantation of silver ions is expanded or the desired implantation depth cannot be obtained even if the implantation of silver ions is carried out at an acute angle. In contrast to this, the present embodiment employs the negative ion implantation method. Therefore, the silicon oxide film is prevented from being electrically charged to a high voltage, and the implanted silver ions can be distributed in conformity to the setting or design. As a result, particles can be formed in a comparatively narrow width of distribution at the desired depth. Therefore, even if, for example, the silicon oxide film, which is formed on the silicon substrate and subjected to the implantation of silver ions, is made thin, it becomes possible to avoid the inconvenience that the silver ions are disadvantageously implanted into the silicon substrate.

As a result of performing processes similar to the aforementioned ones on samples obtained by forming the silicon oxide film into a thin film of a thickness of about 50 nm, silver particles were accurately formed throughout a region at a specified depth, similarly to the aforementioned case using the silicon oxide film of a thickness of 100 nm. Moreover, by reducing the implantation energy and/or controlling the angle of implantation with respect to the surface of the silicon oxide film, it becomes possible to make the silicon oxide film thinner.

(Eighth Embodiment)

In an eighth embodiment, etching of a matrix in which conductive particles are to be formed is performed concurrently with implanting of a material of conductive particles into the matrix. For example, a silicon oxide film formed on a silicon substrate is subjected to anisotropic etching while silver ions are being implanted into the silicon oxide film.

Figure 7A:
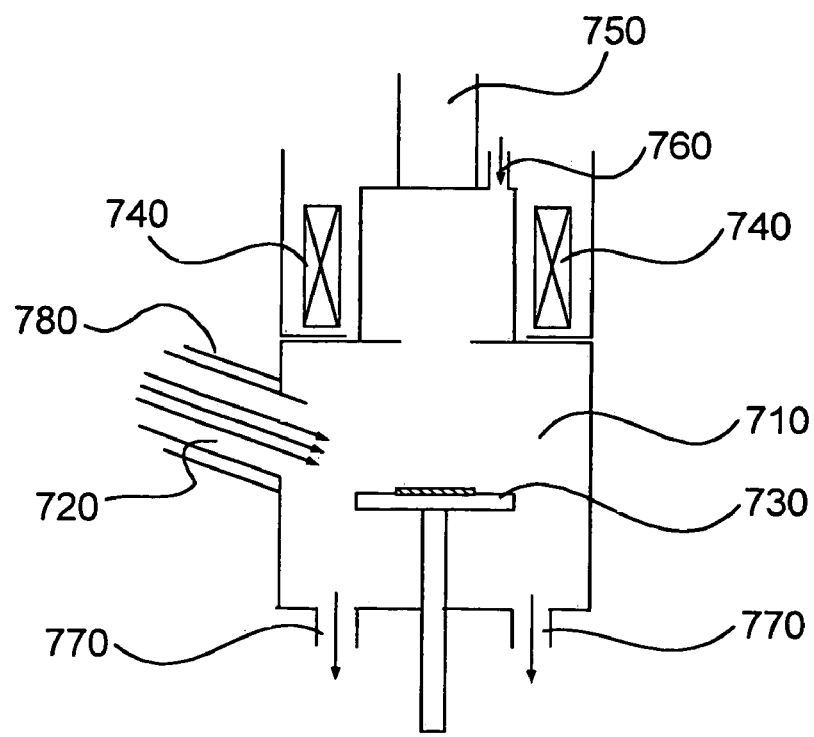
FIGS. 7A and 7B are views showing an apparatus for carrying out a particle forming method according to an eighth embodiment.
Figure 7B:
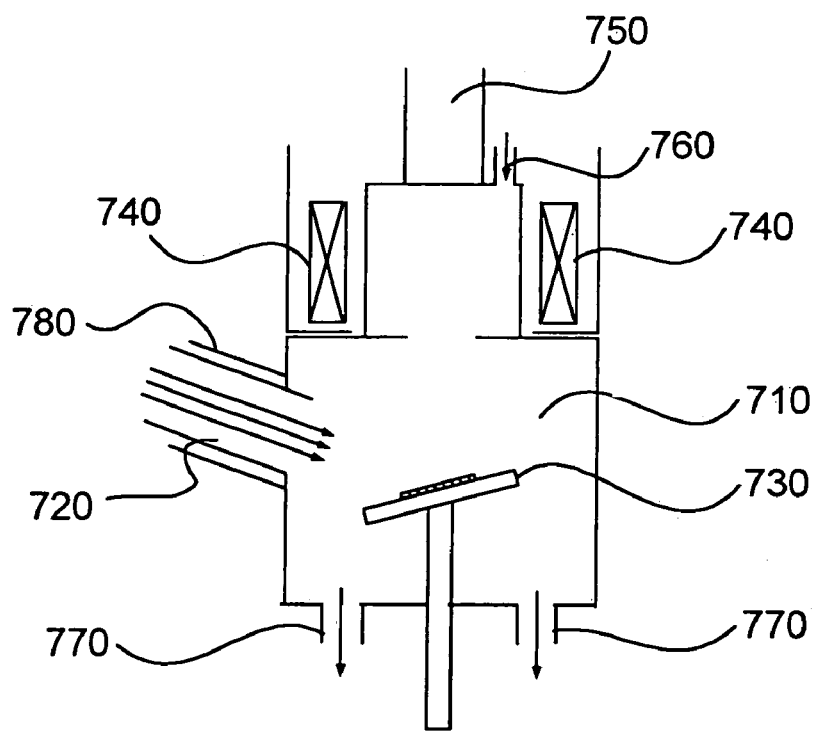

FIGS. 7A and 7B are schematic views showing a system for implanting the material of conductive particles into an insulator. As shown in FIGS. 7A and 7B, this system has a structure in which a reaction chamber 710 of a dry etching apparatus is provided with an outlet of a beam transport section 720 of an ion implanter and concurrently serves as an implantation chamber of the ion implanter. This dry etching apparatus has a coil 740, a microwave waveguide 750, an etching gas introducing tube 760 and evacuation ports 770. Moreover, in the present system, a magnetic shield 780 is provided around the beam transport section 720 to prevent the ion beam from being influenced by the external magnetic field from the coil 740 and so on.

Moreover, in order to carry out oblique implantation of conductor ions into the insulator, the system of the present embodiment is structured such that the direction of incidence of ions has an angle of about 70° with respect to a normal to a substrate holding table 730, as shown in FIG. 7B. Moreover, it is possible to set the direction of implantation of the conductor ions in any desired direction by changing the mounting direction of the beam transport section 720 or providing the beam transport section 720 with a beam path change mechanism.

Alternatively, by providing the substrate holding table 730 with a movable mechanism and thereby changing the inclination of the substrate holding table 730, the direction of implantation into the insulator on the substrate can be arbitrarily set. FIG. 7B is a view schematically showing a state in which only the substrate holding table 730 is inclined at an angle of about 15° from the state of FIG. 7A. Therefore, in the state of FIG. 7B, the angle of implantation of conductor ions is about 55°.

Silver negative ions were implanted into the silicon oxide film of a film thickness of about 40 nm on the silicon substrate at a concentration of about $1 \times 10^{15}/cm^2$ with an implantation energy of about 30 KeV by means of the system of FIG. 7A. In addition to this, the silicon oxide film was etched by about 10 nm at a constant rate by dry etching. In the present embodiment, the average current density of the beam was about 1 $\mu A/cm^2$, and the etching rate was about 4 nm/min.

Subsequently, heat treatment was carried out as in the first through sixth embodiments. In some previous embodiments, particles of the largest particle diameter were formed at the prescribed depth from the surface of the silicon oxide film, and particles of smaller particle diameters were formed above and below that prescribed depth. Moreover, there was a tendency that the density of the particles became nonuniform in the film-thickness direction of the silicon oxide film. However, in the present embodiment, a distribution of silver particles of comparatively uniform particle diameters was obtained in a region from the neighborhood of the surface of the silicon oxide film to a depth of about 10 nm, and the variations in the size and the density of the particles were reduced.

Moreover, in the present embodiment, the oblique implantation for implanting the particle material from the direction that makes an acute angle with respect to the surface of the insulator is carried out. Therefore, the region where the particles are formed can be set to a narrow range in the film-thickness direction of the insulator. Moreover, if the angle of implantation of the—particle material is adjusted, then the range in which the particles are formed in the insulator can be adjusted. Further, the variation in the particle formation range can be further restrained by using negative ions as in the present embodiment, and therefore, the particle formation range can be adjusted with satisfactory accuracy.

Further, by carrying out the process of making the particles insulative, the particle diameter of the conductive particles can be reduced similarly to the other embodiments, and the charge retention characteristic of the conductive particles can be improved. Particularly, in the present embodiment, the conductive particles can be formed in a narrow range in the film-thickness direction of the insulator, and therefore, the insulator film can be formed as a thin film. Moreover, the conductive particles can be formed within the narrow range in the thickness direction of the thin film. Therefore, the surfaces of almost all the particles can be made insulative in a short time, and the time of the insulation process can be shortened. Moreover, since the variation in making the particle surfaces insulative can be restrained, reliability and productivity can be improved.

(Ninth Embodiment)

In a ninth embodiment, nanometer-size conductive particles are formed in an insulator on a conductive substrate by the particle forming method of the present invention, and then an electrode is formed on the insulator by a usually adopted method to thereby construct a memory function body.

Figure 8A:
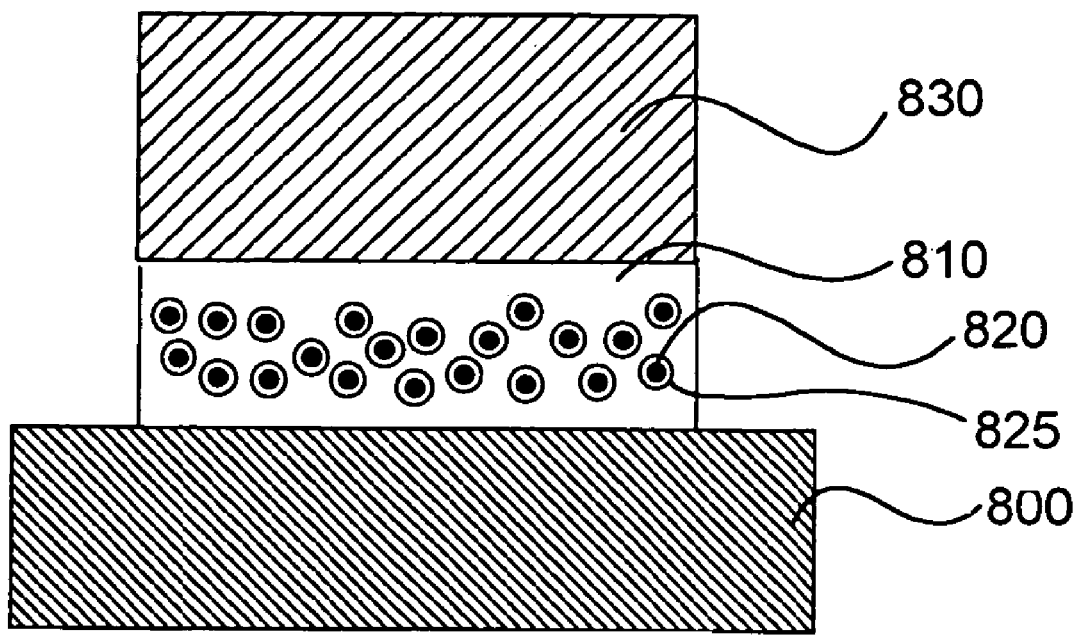
FIG. 8A is a schematic view of a memory function body according to a ninth embodiment.
Figure 8B:
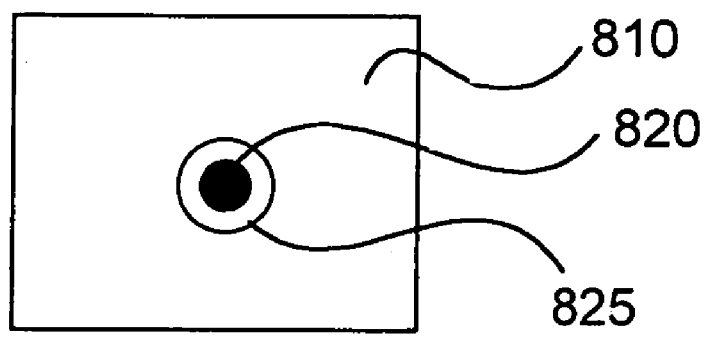
FIG. 8B is an enlarged view of part of FIG. 8A.

FIG. 8A is a schematic view showing the memory function body of the present embodiment. FIG. 8B is an enlarged view of part of FIG. 8A. This memory function body has a silicon oxide film 810 on a substrate 800 as a first conductor, and silver particles 820 each covered with a silver oxide film 825 are formed in the silicon oxide film 810. An electrode 830 formed of aluminum that serves as a second conductor is provided on the silicon oxide film 810.

Figure 9:
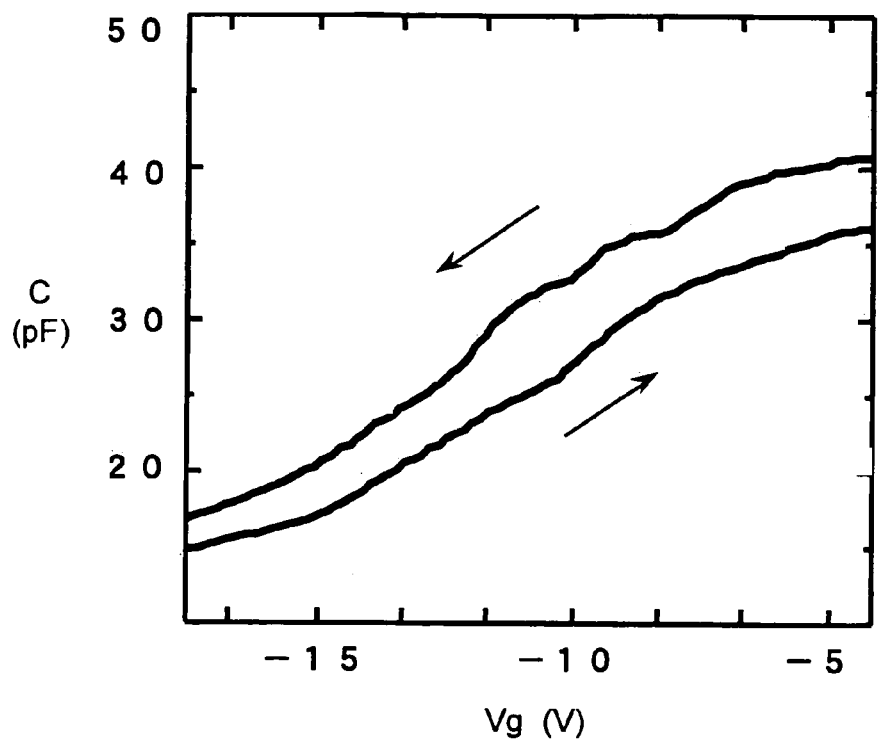
FIG. 9 is a graph showing the voltage (Vg)—capacitance (C) characteristic of the memory function body of the ninth embodiment.

An experiment was carried out by applying a voltage Vg across the silicon oxide film 810 between the silicon substrate 800 and the aluminum electrode 830 of the memory function body, and the capacitance C of the silicon oxide film 810 as the voltage Vg was applied was measured. Curves as shown in FIG. 9 were consequently obtained. In FIG. 9, the horizontal axis represents the voltage applied Vg (V), and the vertical axis represents a capacitance C (pF). As is apparent from FIG. 9, the memory function body exhibits a hysteresis characteristic. As described above, the silicon oxide film 810 including the nanometer-size silver particles 820 of the present embodiment has the hysteresis characteristic. Thus, the silicon oxide film 810 produces the memory function, and a binary value retained therein can be discriminated by comparison of the magnitude of the capacitance measured when the same voltage is applied across the film 810 between the silicon substrate 800 and the aluminum electrode 830.

Moreover, since the memory function body of the present embodiment is fabricated by using the negative ion implantation technique, the silicon oxide film 810 has a quality equivalent to that of a single thermal oxide film. Therefore, this memory function body has very high reliability. Further, the time necessary for manufacturing the memory function body is shorter than in the case where an insulation film and particles are formed by, for example, the CVD (Chemical Vapor Deposition) method. Thus, the memory function body has excellent productivity.

Moreover, since the silver ions are implanted by the negative ion implantation technique, variation in the formation position of the silver particles due to electrification can be restrained, and the silicon oxide film 810 including the silver particles can be formed into a thin film and miniaturized. Further, in comparison with the case where the thickness of the silicon oxide film is comparatively great, an effective electric field applied to the thin silicon oxide film 810 is strengthened even if the same voltage is applied across the electrodes. This therefore makes it possible to use a lower voltage to be applied to the memory function body. Thus, improved productivity and low power consumption property are achieved.

Moreover, because the implantation of the silver ions is effected at an acute angle with respect to the surface of the silicon oxide film 810, the expansion of the distribution of the silver particles 820 in the thickness direction of the silicon oxide film 810 can be restrained. Therefore, the silicon oxide film 810 can be formed into a thin film, and the miniaturization can be effectively achieved.

In order to investigate about the thickness of the silicon oxide film 810, a sample having a silicon oxide film of a thickness of 70 nm was formed by employing the silicon oxide film 110 of the first embodiment, and an experiment was carried out by applying a potential difference to this sample. As a result, the film of the above-mentioned sample did not operate as a memory function body unless the potential difference was increased close to about 10 V. Moreover, when the potential difference of 10 V was given, dielectric breakdown disadvantageously occurred. Therefore, the thickness of the silicon oxide film 810 should preferably be less than 70 nm.

Moreover, if the memory function body of the present embodiment is employed for a capacitor of a conventional DRAM, it becomes possible to provide a low power consumption DRAM that needs no refresh or at least reduces the number of times of refresh to a large extent. Moreover, since no special material as ferroelectrics for ferroelectric memories is needed, a DRAM that can be fabricated through simple processes and has excellent productivity is achievable.

The size of the silver particle 820, which becomes hard to miniaturize when it is extremely large and of which the memory function is degraded when it is extremely small, should preferably have a nanometer size, i.e., a size smaller than 1 μm. In particular, it is preferred that a majority of the silver particles 820 have a particle diameter within a range of larger than 0.1 nm and smaller than 4 nm.

Any substance having electrical conductivity, such as a metal, or polysilicon, can be employed for the electrode.

The present embodiment refers to the case where the silver particles 820 that serve as conductive particles are covered with the silver oxide 825 and are formed in the silicon oxide film 810 that serves as the medium. However, the conductive particle may be formed of another material such as gold, copper, silicon, germanium, aluminum, tungsten, niobium, zirconium, titanium, chromium, tin, cobalt, nickel, iron, antimony, lead or the like. An insulator to cover the conductive particle should be properly obtained by oxidizing or nitriding the conductive particle depending on the material used for the conductive particle. Moreover, the medium (insulator) in which the conductive particles and the insulator covering are to be formed is not limited to the aforementioned silicon oxide and may be formed of silicon nitride, a glass substrate, or another semiconductor.

(Tenth Embodiment)

In a tenth embodiment, a memory function body is fabricated with a material different from that of the ninth embodiment. That is, silicon is implanted at a dose of $1\times10^{15}$ to $1\times10^{16}/cm^2$ into the silicon thermal oxide film under implantation energy of 10 to 15 KeV in place of silver. Then, heat treatment is carried out in a nitriding atmosphere, to cover the silicon particles with SiN to thereby form SiN/Si particles. The heat treatment is carried out for several hours in an ammonia atmosphere at a temperature of about 900° C.

It was discovered that the memory function body fabricated in the present embodiment had a greater hysteresis (i.e., larger memory window) and a more excellent charge retention characteristic than those of memory function bodies fabricated by forming silicon particles by the CVD method. This is ascribed to the fact that the insulator, which serves as a medium containing particles, is a silicon thermal oxide film and therefore has a higher quality than the CVD film and the oxide film of polysilicon. Moreover, the SiN film is formed on the surface of the silicon particles through an annealing process instead of the CVD process. Accordingly, a reduced number of interface states are formed between the silicon particle and the SiN film, which allows an excellent characteristic of reduced leakage of the retained charges to be obtained.

(Eleventh Embodiment)

In an eleventh embodiment as well, a memory function body is formed of a material different from that of the ninth embodiment. That is, conductive particles are formed of aluminum in place of silver. Aluminum is implanted into a silicon oxide film by a dose of about $1\times10^{14}$ to $1\times10^{16}/cm^2$ with implantation energy of 5 to 15 KeV and heat treatment is carried out as in the tenth embodiment. The temperature of this heat treatment is not higher than 600° C. Through this process, a memory function body is obtained, in which $Al_2O_3/Al$ particles consisting of aluminum particles and coating of alumina are scattered in a silicon oxide film.

The memory function body of the present embodiment has a greater hysteresis (i.e., memory window is larger) and a more excellent charge retention characteristic than those of the memory function body that has particles produced by conventional methods. This is ascribed to the fact that the charge storage capability of the conductive particles is excellent since aluminum that is a metal is employed and the fact that those conductive particles are enclosed by aluminum that is a satisfactory insulator so that an excellent charge retention ability is achieved. Moreover, the alumina is in the so-called passive state, and the oxidation scarcely progresses after alumina is formed through the oxidation of the surface of the aluminum particles. Therefore, the characteristics concerning electric charges scarcely change. As a result, the memory function body thus obtained realizes stable memory operation and high reliability.

(Twelfth Embodiment)

In a twelfth embodiment, the conductive particles are formed by a method different from the eleventh embodiment. Specifically, a diffusion method is used instead of the ion implantation method as a method for adding a material for forming conductive particles in an insulator that serves as a medium. For example, aluminum particles are formed in a silicon oxide film similarly to the eleventh embodiment, as will be described. First, a silicon oxide film is formed similarly to the first embodiment. An aluminum film is fabricated by depositing aluminum on the silicon oxide film by means of a vacuum evaporation system. It is acceptable to use a sputtering method instead of the vapor deposition method and use any other suitable method so long as an aluminum film can be formed.

Subsequently, heat treatment is carried out at a temperature of about 400° C. to 600° C. to thereby diffuse aluminum in the silicon oxide film. Subsequently, heat treatment is carried out at a temperature lower than the temperature of diffusion, and thereafter, an oxidation process is carried out.

Subsequently, an electrode is formed similarly to the eleventh embodiment, forming a memory function body. The thus formed memory function body has proved to have an excellent memory characteristic similar to that of the eleventh embodiment.

According to the present embodiment, a memory function body of an excellent characteristic can be fabricated more easily by using the diffusion method than by the ion implantation method.

It is more preferable to employ an AlSi film in place of the aluminum film because the insulator as the medium can be prevented from having a very high concentration near its top surface. Moreover, if a material, of which an oxide forms a passive state, as represented by aluminum, is employed as a conductive particle material, then the surrounding of the particle can be covered with an insulation film of a good quality through oxidation. Thus, use of such a material is more advantageous.

(Thirteenth Embodiment)

In a thirteenth embodiment, nanometer-size conductive particles fabricated by the particle forming method of the present invention are formed in an insulator on a semiconductor substrate, and an electrode is further formed on the insulator by an ordinary method. A substance that has electrical conductivity, such as a metal or polysilicon, can be employed for the electrode. Then, source and drain regions are formed in the semiconductor substrate by a method used for flash memory or other conventional transistors to constitute a field-effect type transistor. In this way, a memory device of the present invention is completed.

Figure 10:
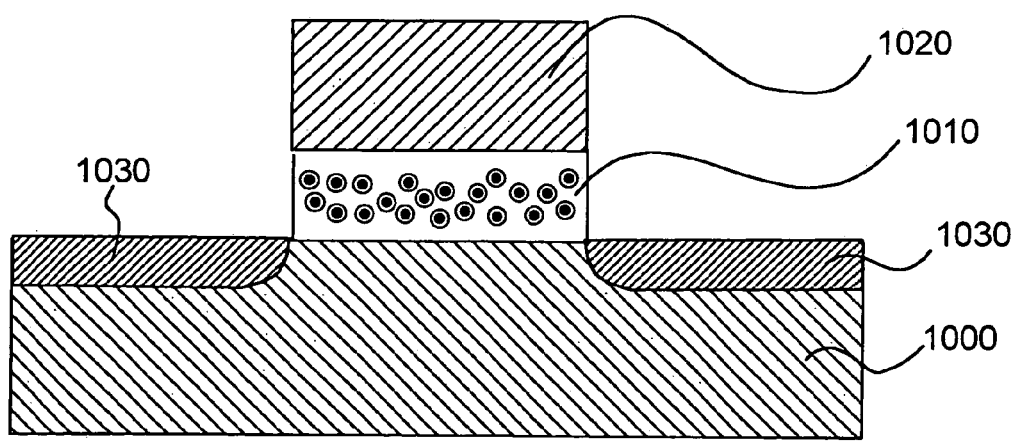
FIG. 10 is a schematic view of a memory device according to a thirteenth embodiment.

FIG. 10 is a schematic view showing the memory device of the present embodiment. As an example, silver particles covered with a silver oxide film are formed in a silicon oxide film 1010 on a silicon substrate 1000. An aluminum film is formed on the silicon oxide film 1010, and a gate electrode 1020 is fabricated from this aluminum film by photolithography and etching. Then, source and drain regions 1030 are formed at the silicon substrate 1000 by an ordinary ion implantation method. Further, an interconnection process is carried out by a conventional method to thereby form a transistor.

The memory device fabricated in the present embodiment was able to obtain different (small and large) threshold values in correspondence with the magnitude of the capacitance as described in connection with the ninth embodiment. That is, in order to execute a write (program) or erase operation, a sufficiently large positive or negative voltage is applied to the gate electrode 1020 similarly to the floating-gate type memory. In order to execute a read operation, a current flowing between the source and drain regions 1030 is detected. In the memory device of the present embodiment, a difference of about 2 V in threshold took place between immediately after the application of a voltage of +15 V and immediately after the application of a voltage of −15 V to the gate electrode 1020. Therefore, the memory device of the present embodiment can execute the memory operation similar to that of the flash memory or the like.

Moreover, the memory device of the present embodiment includes the silicon oxide film 1010 containing particles formed by the particle forming method of the present invention. Since this silicon oxide film 101 can be formed into a thin film, it is possible to achieve miniaturization of the device and a reduction in the operating voltage. Furthermore, since neither complicated processes inherent to the fabrication of the flash memories nor a special material needed by the ferroelectric memories is employed, excellent productivity is achieved.

The thickness of the gate insulation film (silicon oxide film 1010) is set to about 50 nm in the present embodiment, although it is a matter of course that the film thickness can be further reduced and a reduction in the film thickness can be achieved within a range in which the film thickness does not become smaller than the size of the particle. The gate electrode should preferably be smaller than 5 nm, and this makes it possible to allow the device to be driven with a reduced voltage of less than 10 V.

(Fourteenth Embodiment)

In a fourteenth embodiment, a memory device is fabricated by constituting a field-effect type transistor by employing a silicon oxide film obtained by reducing the thickness of the silicon thermal oxide film fabricated in the tenth embodiment to a thickness of about 5 to 10 nm as a gate insulation film. This memory device has a construction similar to that of the thirteenth embodiment except for the gate insulation film.

The gate insulation film was fabricated by a method similar to that of the tenth embodiment, and the silver ions were implanted at an incident angle of about 65 to 80° with respect to the normal to the surface of the silicon thermal oxide film in the ion implantation process. Moreover, the thickness of the silicon thermal oxide film at the ion implantation was about 25 nm, and in a subsequent process the silicon thermal oxide film was thinned by etching by about 10 to 20 nm.

As a result of subjecting the memory device of the present embodiment to measurement similarly to the tenth embodiment, a difference of about 2 V was generated, in terms of the threshold value, between an instant immediately after the application of a voltage of +3 V and an instant immediately after the application of a voltage of −3 V to the gate.

As can be understood from above, the memory device of the present embodiment has proved that it can perform a memory operation equivalent to that of the flash memory or the like even at a low voltage with which the normal flash memory hardly operates.

The above is presumably ascribed to the fact that because the conductive particles in the silicon oxide film that operates as the gate insulation film are covered with oxide, the quantum effect is allowed to remarkably appear and therefore electrons can be injected into the particles at a low voltage. The above is presumably ascribed further to the fact that the leakage of electrons is restrained by the Coulomb blockade effect.

The memory device provided with the gate insulation film that has the particles formed by the particle forming method of the present invention should preferably have its gate insulation film thickness reduced to such an extent that the thickness does not become smaller than the size of the particles contained in this gate insulation film and more concretely be set smaller than 5 nm. This allows the memory device to be operable with a low voltage or made drivable at a voltage lower than 10 V.

Moreover, the fabrication of the memory device, which uses the particle forming method of the present invention, is easy and has affinity or compatibility with conventional silicon processes. Therefore, the memory device of the present invention is able to be incorporated in any kind of electronic equipment employing an integrated circuit, such as, for example, a mobile phone. The electronic equipment, which is provided with the memory device of the present invention, can effectively achieve reduction in size and power consumption.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A memory function body comprising:
a lower conductor and an upper conductor;
a medium that is formed between the lower conductor and the upper conductor and made of a first material;
a plurality of particles that are located in different depths within the medium set away from each of all surfaces of the medium and made of a third material, and
covers, formed within the medium and set away from each surface of the medium, that cover the entire surface of each of the particles and are made of a second material,
the second material being a material capable of functioning as a barrier against passage of electric charges, and
the third material being a material that is capable of retaining electric charges,
wherein
the covers for the particles closer to the upper conductor are thicker than the covers for the particles closer to the lower conductor.

2. The memory function body as claimed in claim 1, wherein said covers that cover the entire surface of each of the particles is completely embedded within the medium.

3. The memory function body as claimed in claim 1, wherein said medium is formed as a single layer.

* * * * *